US012578384B2

(12) United States Patent
Muthrasanallur et al.

(10) Patent No.: US 12,578,384 B2
(45) Date of Patent: Mar. 17, 2026

(54) UNIFIED TEST AND DEBUG CHIPLET ARCHITECTURE

(71) Applicant: Intel Corporation, Santa Clara, CA (US)

(72) Inventors: Sridhar Muthrasanallur, Bengaluru (IN); Debendra Das Sharma, Saratoga, CA (US); Swadesh Choudhary, Mountain View, CA (US); Gerald Pasdast, San Jose, CA (US); Peter Onufryk, Flanders, NJ (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 18/537,076

(22) Filed: Dec. 12, 2023

(65) Prior Publication Data

US 2024/0329129 A1     Oct. 3, 2024

Related U.S. Application Data

(63) Continuation of application No. PCT/US2023/024437, filed on Jun. 5, 2023.

(30) Foreign Application Priority Data

Mar. 29, 2023     (IN) ............................. 202341023191

(51) Int. Cl.
  *G06F 11/27*          (2006.01)
  *G01R 31/317*        (2006.01)
  *G06F 13/42*          (2006.01)
(52) U.S. Cl.
  CPC ........ *G01R 31/31705* (2013.01); *G06F 11/27* (2013.01); *G06F 13/4221* (2013.01); *G06F 2213/0026* (2013.01)

(58) Field of Classification Search
  CPC ................. G06F 11/27; G06F 16/4221; G06F 2213/0026; G06F 15/7807; G01R 31/31705; H01L 25/0655
  See application file for complete search history.

(56) References Cited

U.S. PATENT DOCUMENTS

| | | | | |
|---|---|---|---|---|
| 6,751,583 B1 * | 6/2004 | Clarke | ..................... | G06F 30/33 703/22 |
| 7,475,303 B1 * | 1/2009 | Edgar | ................. | G06F 11/2236 714/724 |

(Continued)

FOREIGN PATENT DOCUMENTS

KR      20170070687 A      6/2017

OTHER PUBLICATIONS

International Search Report and Written Opinion for Application No. PCT/US2023/024437, mailed on Dec. 20, 2023, 9 pages.

(Continued)

*Primary Examiner* — Joseph O Schell
(74) *Attorney, Agent, or Firm* — Alliance IP, LLC

(57)          ABSTRACT

Technologies for a unified debug and test architecture in chiplets is disclosed. In an illustrative embodiment, several chiplets are integrated on an integrated circuit package. The chiplets are connected by a package interconnect, such as a universal chiplet interconnect express (UCIe) interconnect. Each chiplet includes several debug nodes, which are connected by an on-chiplet network. One of the chiplets, referred to as a package debug endpoint, acts as a link endpoint for an off-package link, such as a peripheral component interconnect express (PCIe) link. In use, debug messages can be sent to the package debug endpoint over a PCIe link. The debug messages can be routed within the chiplets and between chiplets, allowing for the debug functionality at each debug node to be probed using a common (Continued)

protocol. In this manner, chiplets from different vendors can be integrated into the same package and tested using common software.

20 Claims, 7 Drawing Sheets

(56) References Cited

U.S. PATENT DOCUMENTS

| | | | |
|---|---|---|---|
| 2004/0113668 A1 | 6/2004 | Gaskins et al. | |
| 2013/0212425 A1* | 8/2013 | Blaine | G06F 11/3648 |
| | | | 714/6.1 |
| 2014/0013172 A1 | 1/2014 | Hopkins | |
| 2019/0113568 A1* | 4/2019 | Bowling | G11C 29/26 |
| 2019/0353705 A1 | 11/2019 | Hopkins et al. | |
| 2022/0138387 A1* | 5/2022 | Narayanun | G06F 30/394 |
| | | | 716/103 |
| 2023/0027585 A1* | 1/2023 | Weng | H04L 45/745 |
| 2023/0041130 A1* | 2/2023 | Capalija | G06F 15/7807 |
| 2023/0305993 A1* | 9/2023 | Davis | G06F 1/28 |
| 2024/0296102 A1* | 9/2024 | Isachar | G06F 11/2242 |
| 2024/0330183 A1* | 10/2024 | Kovac | G06F 12/0873 |

OTHER PUBLICATIONS

Universal Chiplet Interconnect Express (UCIe). Specification Revision 1.0, Feb. 24, 2022, 288 pages.

* cited by examiner

100

500

REGISTERS

BYTE

| | | |
|---|---|---|
| Udx_CAP[23:0] | U_CPID=0 | 0 |
| UDX_Stat | RSVD | RSVD:Length[9:0] | 4 |
| RSVD | Next_CAPID | 8 |
| U_DID | U_VID | 16 |
| U_PDID | U_PVID | 20 |
| RSVD | Rt_Base | Rt_Len | 24 |
| MAILBOX INDEX HIGH | 28 |
| MAILBOX INDEX LOW | 32 |
| MAILBOX DATA | 36 |
| RSVD | MB Status | MB Ctl | 40 |
| RSVD | 60 |
| VENDOR DEFINED | LENGTH*4-4 |

800

802 — CREATE CHIPLETS WITH DEBUG CIRCUITRY

804 — TEST CHIPLETS USING DEBUG CIRCUITRY

806 — INTEGRATE CHIPLETS INTO PACKAGE

808 — TEST CHIPLETS IN PACKAGE USING DEBUG CIRCUITRY

810 — INTEGRATE PACKGE INTO SYSTEM

812 — TEST CHIPLETS IN SYSTEM USING DEBUG CIRCUITRY

UNIFIED TEST AND DEBUG CHIPLET ARCHITECTURE

CROSS-REFERENCE TO RELATED APPLICATIONS

This application is a continuation of International Application No. PCT/US2023/024437, filed Jun. 5, 2023, entitled "TECHNOLOGIES FOR A UNIFIED TEST AND DEBUG ARCHITECTURE," which application claims the benefit under 35 U.S.C. § 119(a) of Indian patent application no. 202341023191, filed on Mar. 29, 2023, entitled "TEST AND DEBUG INFRASTRUCTURE FOR UNIVERSAL CHIP-LET INTERCONNECT EXPRESS (UCIe)-BASED CHIP-LETS AND PACKAGES," the entirety of which application is incorporated herein by reference in its entirety.

BACKGROUND

In recent years, there has been a significant shift in the field of integrated circuits (ICs) towards the use of chiplets as opposed to traditional monolithic chips. Chiplets are smaller, self-contained semiconductor components that perform specific functions, such as processing, memory, or communication. This shift has been driven by the increasing complexity and diversification of modern ICs, as well as the limitations imposed by the fabrication processes of larger chips. By employing chiplets, designers can achieve greater flexibility, modularity, and cost efficiency in their IC designs. These chiplets can be manufactured independently, enabling different technology nodes, customizations, and improved yields. Additionally, they can be combined and interconnected in various configurations, forming a package-level system that offers superior performance and scalability.

To connect chiplets in a packet, a common protocol such as UCIe™ (Universal Chiplet Interconnect express) can enable seamless integration and interoperation of chiplets within an integrated circuit package. Such a protocol can address the challenges associated with diverse chiplet architectures, interfaces, and power requirements, thereby promoting compatibility and interoperability between chiplets from different manufacturers.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
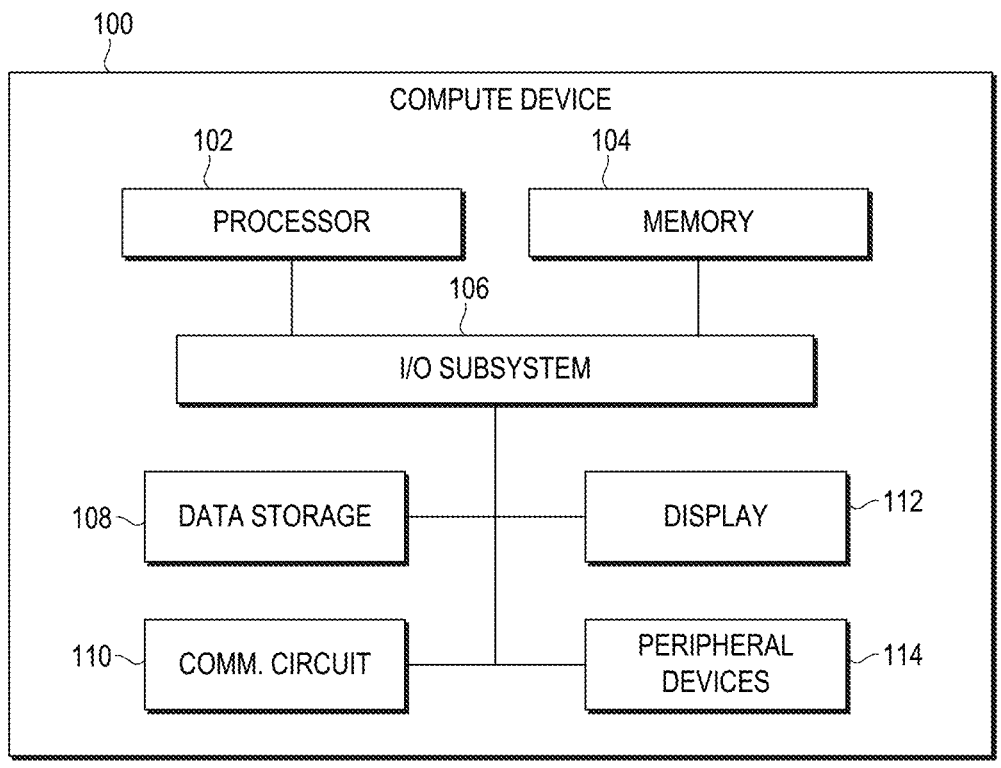
FIG. 1 is a simplified drawing of at least one embodiment of a compute device.

In various embodiments disclosed herein, a compute device may include several integrated circuit packages, each with several chiplets. The chiplets in the package implement a unified test and debug architecture that allows debug messages to be sent between and within the various chiplets, allowing the functionality of different parts of different chiplets to be tested. The chiplets can be tested at several stages of manufacturing, from sort stage testing of a single chiplet to infield debugging at a system level of an integrated circuit package with several chiplets from several vendors.

The unified test and debug architecture implemented in chiplets and integrated circuit packages includes an external hardware debug interface that is interface-agnostic. Debug nodes in chiplets can be sent debug messages or packets. In an illustrative embodiment, the debug messages are universal chiplet interconnect express (UCIe™) packets. These packets can be natively sent on the debug interface or tunneled, allowing for multiple different test and debug interface solutions, such as Joint Test Action Group (JTAG), inter-integrated circuit (I2C), improved inter-integrated circuit (I3C), universal serial bus (USB), system management bus (SMBus), general purpose input/output (GPIO), or UCIe™ pin bump. Such an approach would allow for upper-layer test/debug software that is reusable. As described in more detail below, the architecture also specifies how debug messages are sourced and routed through a package containing multiple chiplets, thus allowing for an interoperable debug/test solution. In some cases, debug messages can themselves be tunneled via management component transport protocol (MCTP) vendor-defined packets, allowing for the debug functionality to be discovered/controlled as a sub-network and/or meshed as part of an MCTP fabric.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, electromagnetic radiation). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Optical components such as fibers or waveguides may be "connected" if the gap between them is small enough that light can be transferred from one fiber or waveguide to another fiber or waveguide without any intervening optical elements, such as a lens or mirror. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Referring now to FIG. 1, in one embodiment, a compute device 100 is shown. The illustrative compute device 100 may include one or more integrated circuit packages 302 (see FIG. 3), each of which may include one or more chiplets 202 (see FIG. 2). The integrated circuit packages 302 and chiplets 202 may implement a unified test and debug architecture, allowing for the components of the compute device 100 to be tested at the chiplet level.

The compute device 100 may be embodied as any type of compute device. For example, the compute device 100 may be embodied as or otherwise be included in, without limitation, a server computer, an embedded computing system, a System-on-a-Chip (SoC), a multiprocessor system, a processor-based system, a consumer electronic device, a smartphone, a cellular phone, a desktop computer, a tablet computer, a notebook computer, a laptop computer, a networked computer, a wearable computer, a handset, a messaging device, a camera device, and/or any other compute device. In some embodiments, the compute device 100 may be located in a data center, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves).

The illustrative compute device 100 includes a processor 102, a memory 104, an input/output (I/O) subsystem 106, data storage 108, a communication circuit 110, a display 112, and one or more peripheral devices 114. In some embodiments, one or more of the illustrative components of the compute device 100 may be incorporated in, or otherwise form a portion of, another component. For example, the memory 104, or portions thereof, may be incorporated in the processor 102 in some embodiments. In some embodiments, one or more of the illustrative components may be physically separated from another component.

The processor 102 may be embodied as any type of processor capable of performing the functions described herein. For example, the processor 102 may be embodied as a single or multi-core processor(s), a single or multi-socket processor, a digital signal processor, a graphics processor, a neural network compute engine, an image processor, a microcontroller, or other processor or processing/controlling circuit. Similarly, the memory 104 may be embodied as any type of volatile or non-volatile memory or data storage capable of performing the functions described herein. In operation, the memory 104 may store various data and software used during operation of the compute device 100 such as operating systems, applications, programs, libraries, and drivers. The memory 104 is communicatively coupled to the processor 102 via the I/O subsystem 106, which may be embodied as circuitry and/or components to facilitate input/output operations with the processor 102, the memory 104, and other components of the compute device 100. For example, the I/O subsystem 106 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. The I/O subsystem 106 may connect various internal and external components of the compute device 100 to each other with use of any suitable connector, interconnect, bus, protocol, etc., such as an SoC fabric, PCIe®, USB2, USB3, USB4, NVMe®, Thunderbolt®, and/or the like. In some embodiments, the I/O subsystem 106 may form a portion of a system-on-a-chip (SoC) and be incorporated, along with the processor 102, the memory 104, and other components of the compute device 100 on a single integrated circuit chip.

The data storage 108 may be embodied as any type of device or devices configured for the short-term or long-term storage of data. For example, the data storage 108 may include any one or more memory devices and circuits, memory cards, hard disk drives, solid-state drives, or other data storage devices.

The communication circuit 110 may be embodied as any type of interface capable of interfacing the compute device 100 with other compute devices, such as over one or more wired or wireless connections. In some embodiments, the communication circuit 110 may be capable of interfacing with any appropriate cable type, such as an electrical cable or an optical cable. The communication circuit 110 may be configured to use any one or more communication technology and associated protocols (e.g., Ethernet, Bluetooth®, Wi-Fi®, WiMAX, near field communication (NFC), etc.). The communication circuit 110 may be located on silicon separate from the processor 102, or the communication circuit 110 may be included in a multi-chip package with the processor 102, or even on the same die as the processor 102. The communication circuit 110 may be embodied as one or more add-in-boards, daughtercards, network interface cards, controller chips, chipsets, specialized components such as a field programmable gate array (FPGA) or application specific integrated circuit (ASIC), or other devices that may be used by the compute device 100 to connect with another compute device. In some embodiments, communication circuit 110 may be embodied as part of a system-on-a-chip (SoC) that includes one or more processors, or included on a multichip package that also contains one or more processors. In some embodiments, the communication circuit 110 may include a local processor (not shown) and/or a local memory (not shown) that are both local to the communication circuit 110. In such embodiments, the local processor of the communication circuit 110 may be capable of performing one or more of the functions of the processor 102 described herein. Additionally or alternatively, in such embodiments, the local memory of the communication circuit 110 may be integrated into one or more components of the compute device 100 at the board level, socket level, chip level, and/or other levels.

In some embodiments, the compute device 100 may include other or additional components, such as those commonly found in a compute device. For example, the compute device 100 may also have peripheral devices 114, such as a keyboard, a mouse, a speaker, an external storage device, etc. In some embodiments, the compute device 100 may be connected to a dock that can interface with various devices, including peripheral devices 114. The compute device 100 may include several additional components, such as a battery, one or more antennas, one or more connectors (such as one or more USB2 connectors, one or more USB3 connectors, an SD card slot, a headphone and/or microphone jack, a power connector, etc.), etc.

Figure 2:
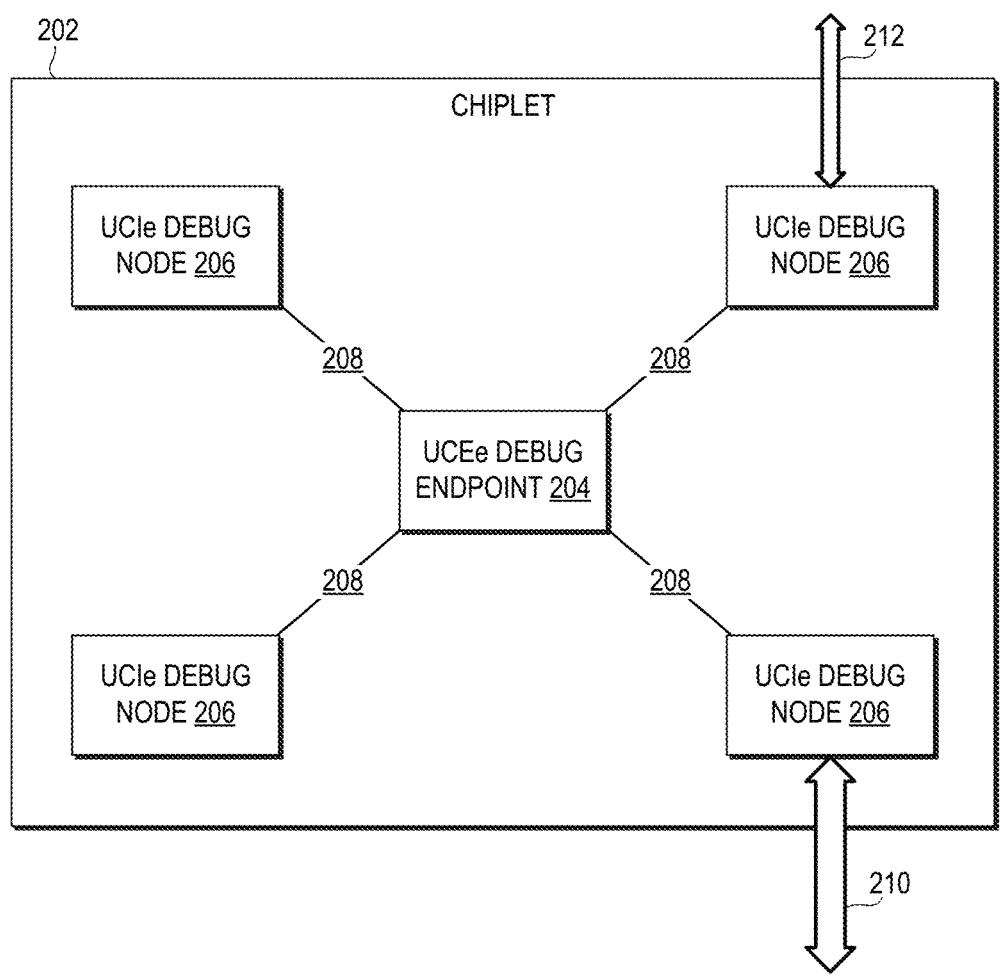
FIG. 2 is a simplified drawing of at least one embodiment of a chiplet of the compute device of FIG. 1.
Figure 3:
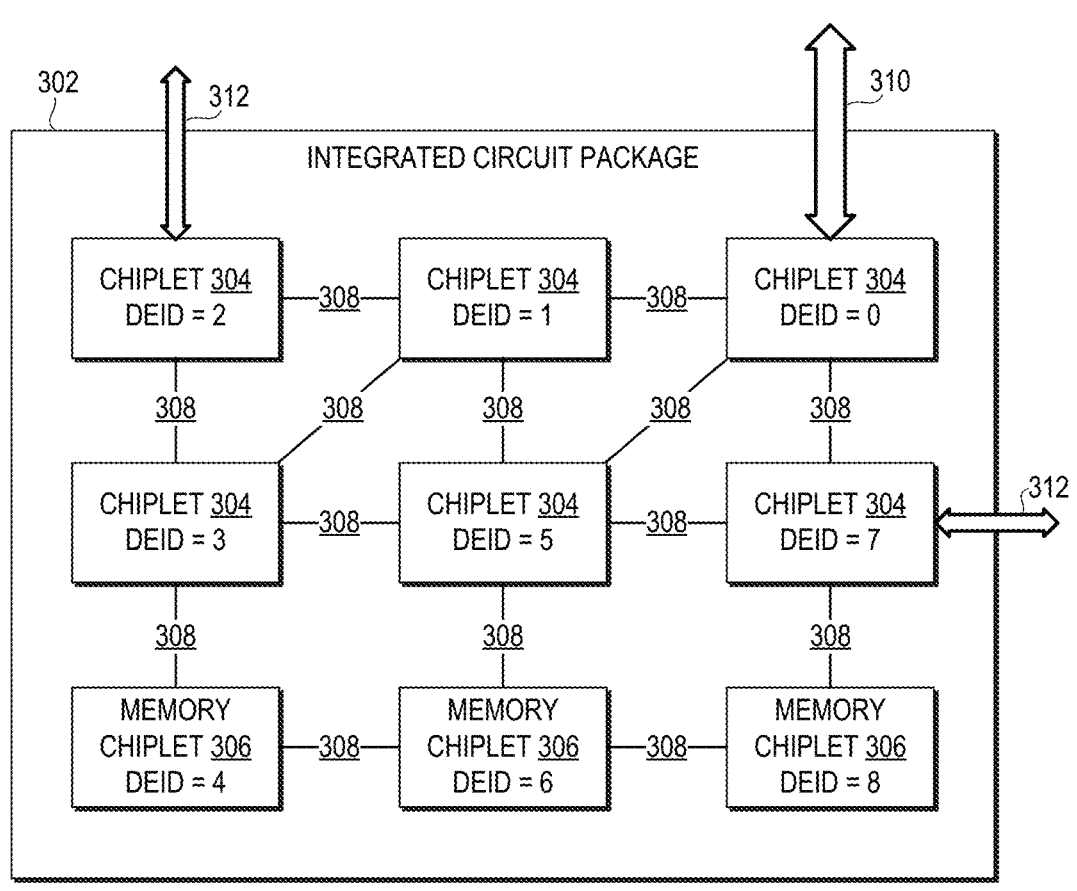
FIG. 3 is a simplified drawing of at least one embodiment of an integrated circuit package of the compute device of FIG. 1 with the chiplet of FIG. 2.

Referring now to FIGS. 2 and 3, in an illustrative embodiment, a chiplet 202 of the compute device 100 is shown in FIG. 2, and an integrated circuit package 302 is shown in FIG. 3. The chiplet 202 shown in FIG. 2 may be integrated with other chiplets 202 in an integrated circuit package 302, as shown in FIG. 3. The chiplet 202 may correspond to any suitable part of any suitable integrated circuit package 302, such as the processor 102, the memory 104, the data storage 108, the communication circuitry 110, any other suitable part of the compute device 100.

The illustrative chiplet 202 includes a debug endpoint 204 and one or more debug nodes 206. In an illustrative embodiment, the debug endpoint 204 and the debug nodes 206 implement a version of or are otherwise compatible with the UCIe™, such as the UCIe™ v. 1.0 specification, released by the UCIe Consortium on Mar. 2, 2022. In the illustrative embodiment, the debug endpoint 204 acts as a hub, and the debug nodes 206 act as spokes. The illustrative debug endpoint 204 is the central block for coordinating all debug actions within the chiplet 202. Each debug node 206 is responsible for test and debug functions of various interfaces or functions within the chiplet 202. The debug endpoints 204 may also be referred to as a UCIe™ test and debug hub (UDH). The debug nodes 206 may also be referred to as a UCIe™ Test and Debug Spoke (UDS) or debug agent. The chiplet 202 may include any suitable number of debug nodes 206, such as 1-1,024. In some embodiments, the debug endpoints 204 may include debug functionality. For that reason, the debug endpoints 204 may also be referred to as debug nodes 206.

The illustrative integrated circuit package 302 includes one or more chiplets 304 and/or memory chiplets 306. The chiplets 304, 306 may be embodied as the chiplets 202. The chiplets 304, 306 may be connected by a package interconnect circuitry 308. The package interconnect circuitry 308 may be configured to implement any suitable protocol, such as UCIe™ Off-package interconnect 310 may connect to a test/debugger using another interface, such as PCIe. Off-package interconnects 312 may connect to other packages or other components using the same protocol as the package interconnect 308.

In the illustrative embodiment, the integrated circuit package 302, one or more of the chiplets 304, 306 will have an appropriate debug hardware interface pinned out, such as PCIe, SMBus, JTAG, GPIO, USB, I2C/I3C, etc. That (or those) chiplet 304, 306 (or the debug endpoint 204 within them) will be the package-level debug endpoint or package debug endpoint for the integrated circuit package 302. The package debug endpoint may also be referred to as a package level UCIe test and debug hub, or pUDH. The package debug endpoint is responsible for receiving test/debug commands from an external tester/debugger and forwarding the commands as necessary to various debug endpoints 204 and debug nodes 206 in the integrated circuit package 302.

In the illustrative embodiment, communication between the debug nodes 206 and the debug endpoint 204 is through interconnects 208. The interconnects 208, debug endpoint 204, and debug nodes 206 form an on-chiplet network, allowing for communication between the debug endpoint 204 and debug nodes 206 through debug messages. In the illustrative embodiment, the interconnect 208 is a UCIe™ interconnect, and communication between the debug nodes 206 and the debug endpoint 204 is through UCIe™ packets. One of the debug nodes 206 may be connected to another chiplet through a chiplet-chiplet interconnect 212, which may be a UCIe™ interconnect. One of the debug nodes 206 may also be connected to an external tester/debugger through an external interconnect 210. The external interconnect 210 may be, e.g., peripheral component interconnect express (PCIe). Debug messages may be sent over a PCIe link as a normal PCIe vendor-defined message (VDM) transportation layer packet (TLP) using UCIe™ vendor ID, can be embodied or wrapped within a no operation (NOP) PCIe flit, can be tunneled over or wrapped in another protocol such as I2C, I3C, SMBus, GPIO, USB, or can be setup via registers in a JTAG based test/debug setup. Debug messages may also be referred to as UCIe™ debug messages or UCIe™ debug vendor-defined message (UDV) packets. In the illustrative embodiment, the external interconnects 210, 212 are connected to debug nodes 206. Additionally or alternatively, in some embodiments, the external interconnects 210, 212 may be connected to debug endpoints 204.

In the illustrative embodiment, the debug endpoint 204 is addressed by an 8-bit endpoint ID in the debug message

Figures 6, 7:
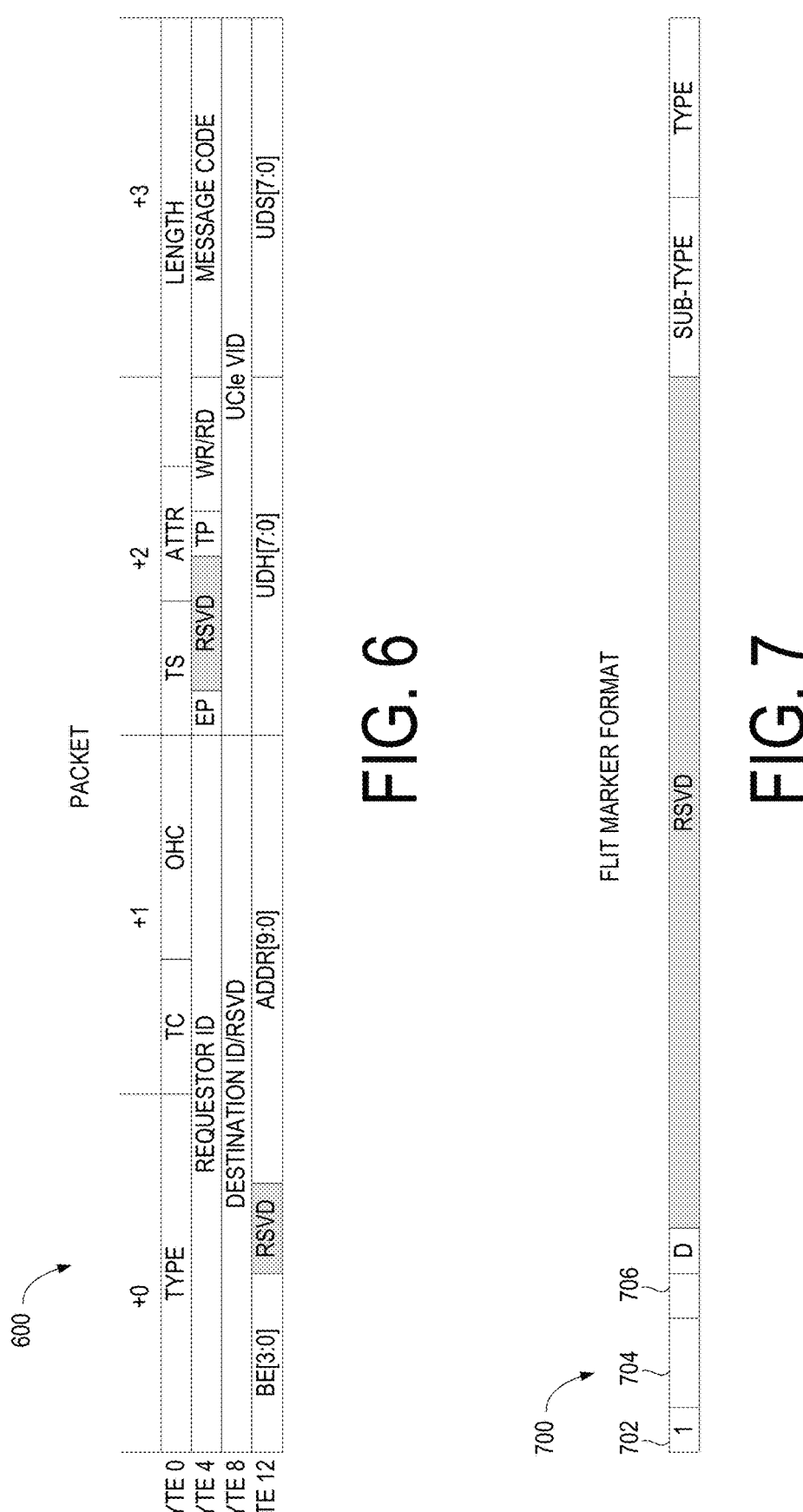
FIG. 6 is a diagram of one embodiment of a debug message that may be sent or received by the chiplet of FIG. 2.
FIG. 7 is a diagram of one embodiment of a flit that may be sent or received by the chiplet of FIG. 2.

8 header 600 (see FIG. 6). After a reset, the debug endpoint ID (DEID) in the first debug message that a chiplet 202 receives is used by the illustrative debug endpoint 204 as its endpoint ID until the next reset of the chiplet 202. The package debug endpoint 204 is always assigned a debug endpoint ID of 0. A chiplet 202 also stores the port over which it received the first debug message for completion-debug message routing purposes. In the illustrative embodiment, the endpoint ID of 0 is reserved for the package debug endpoint 204, and the endpoint ID of 0xFF is reserved for broadcast. A debug message for read completion always indicates a debug endpoint ID of 0, forwarding the read completion to the target port identified when the debug system is initialized after reset.

The illustrative debug endpoint 204 provides a set of registers (see FIG. 5), including standardized ones and, optionally, proprietary ones. In the standardized set of registers, debug endpoints 204 present the vendor ID (VID) of the vendor of the chiplet 202 as well as the device ID (DID) assigned by the vendor to the chiplet 202. The illustrative registers may also include package vendor ID (PVID) and package device ID (PDID) of the package-level integrator of the corresponding package 302.

Each of the debug nodes 206 within a chiplet 202 is assigned a unique debug node ID within the chiplet 202. Assignment of the debug node ID is design-specific. The debug endpoint 204 uses the debug node ID to route debug messages to the correct debug node 206. In the illustrative embodiment, a debug node ID value of 0 is assigned for registers within the debug endpoint 204 itself and also potentially for any integrated debug node functionality present within the debug endpoint 204. The illustrative debug nodes 206 may provide a set of registers similar to or the same as the debug endpoint 204. The debug nodes 206 provide a set of standardized mailbox registers that can be read and written using debug messages. The address offset of the register being read or written is provided in debug message. For example, mailbox registers could be used to trigger various debug actions, report status of various debug actions, simple monitoring of debug signals, etc. In some embodiments, if a debug node 206 type field corresponds to a standard specification such as PCIe, CXL, or UCIe, standard registers defined in those specifications for test or compliance may be accessed via debug messages as well. To facilitate such an approach, a mailbox index register may provide encodings for accessing the standardized capabilities for, e.g., PCIe, CXL, or UCIe via capability IDs and offset.

In one embodiment, the mailbox registers are defined as shown in Tables 1-6.

TABLE 1

| mailbox index low (offset 0x20): | | |
|---|---|---|
| Bit | Attribute | Description |
| 7:0 | RW | Opcode:<br>0x0: 32b Cfg Rd<br>0x1: 32b Cfg Wr<br>0x2: 32b Mem Rd<br>0x3: 32b Mem Wr<br>0x4-0xE: Rsvd<br>0xF: Vendor-defined<br>CfgRd/Wr used to access all standard config space capabilities defined in PCIe/CXL/UCIe specifications and also any DVSEC capabilities integrated UiRB in UCIe specifications. MemRd/Wr are used for MMIO space register accesses, sans the DVSEC that are integrated as part of UiRB. These commands are valid only when the spoke is one of PCIe, |

TABLE 1-continued

| | | mailbox index low (offset 0x20): |
|---|---|---|

| Bit | Attribute | Description |
|---|---|---|
| | | CXL or UCIe types. For any other spoke type, executing these commands would result in UR response. |
| | | For Vendor-defined opcode, rest of Mailbox index/data High and Low register fields become vendor-defined. Description of Attribute and functionality for rest of the bits in this register and the Mailbox Index High register, is done only for CfgRd/Wr, MemRd/Wr opcodes and attribute/behavior of these bits for Vendor-defined opcode is vendor-specific. |
| 11:8 | RW | BE[3:0]: Applies for opcodes 0x0-0x3. Rsvd for Opcodes 0x4-0xE. |
| 15:12 | Rsvd | Rsvd |
| 31:16 | RW | PCIe-CAP_ID/CXL_UCIe_DVSEC_ID: Applies to only CfgRd/Wr opcodes. This field is reserved for Opcodes 0x2-0xE. For accessing the PCIe defined standard capabilities, PCIe-CAP ID must be specified here. If CXL/UCIe defined DVSEC capabilities are to be accessed, the associated 16b DVSEC_ID must be specified in this field. |

TABLE 2

| | | mailbox index high (offset 0x24): |
|---|---|---|

| Bit | Attribute | Description |
|---|---|---|
| 51:32 | RW | Address Offset [19:0]: For Config Rd/Wr opcodes, bits 51:44 are reserved |
| 54:52 | RW | Register Locator 0-7: For MemRd/Wr opcodes this indicates which register locator memory group is being accessed. For CfgRd/Wr and Opcodes 0x4-0xF, this field is reserved. |
| 56:55 | RW | Register group: Applies only to opcodes 0x0-0x3. 0x0 - PCIe standards defined Config Capabilities 0x1 - CXL standards defined DVSEC capabilities (or) Register Locator registers 0x2 - UCIe standards defined DVSEC capabilities (or) Register Locator registers 0x3 - Rsvd |
| 57 | RW | Extended Capability - Applies only to opcodes 0x0-0x1. Rsvd for opcodes 0x2-0xF and vendor-defined for other opcodes. 0x0 - PCIe standard config Capability 0x1 - PCIe extended config capability |
| 63:58 | Rsvd | Rsvd for opcodes 0x0-0xF |

TABLE 3

| | | mailbox data low (offset 0x28): |
|---|---|---|

| Bit | Attribute | Description |
|---|---|---|
| 31:0 | RW | Data associated with request opcode |

TABLE 4

| | | mailbox data high (offset 0x2C): |
|---|---|---|

| Bit | Attribute | Description |
|---|---|---|
| 63:32 | RW/Rsvd | Data associated with request opcode. Optional for PCIe/CXL/UCIe spokes if no vendor-specific commands in that spoke need this field. |

TABLE 5

| | | mailbox control: |
|---|---|---|
| Bit | Attribute | Description |
| 0 | RW, with auto clear | Command trigger: When this bit is written to a 1 from a value of 0, the mailbox executes the command. This bit automatically clears when the command triggered by this bit being set, is complete. SW can poll this bit to know when the operation has actually completed. It can then go read the Mailbox data register for the read data or any vendor-defined data. |
| 7:1 | Rsvd | Reserved |

TABLE 6

| | | mailbox status (offset 0x31): |
|---|---|---|
| Bit | Attribute | Description |
| 1:0 | RWIC | Operation completion status: 00 - CA received 01 - UR received 01 - Reserved (opcodes 0x0-0xE) and vendor-defined for vendor-defined opcode 11 - Success This bit has valid value only when the Command Trigger bit is cleared from being a 1 prior to it. |
| 7:2 | Rsvd | Reserved |

A debug node 206 may perform any suitable debugging action, such as a self-test, debug, repair, telemetry monitoring, etc. For example, a debug node 206 for a memory array inside the chiplet 202 may perform and report on a memory built-in self test (MEMBIST). The same debug node 206 may have its error-related telemetry/repair exposed during run-time. Similarly, an external link like PCIe/compute express link (CXL)/UCIe can have its test, debug, repair, and telemetry capability exposed through a corresponding debug node 206.

In use, a debug message sent to the chiplet 202 is received by the debug endpoint 204, either directly or by being routed through a debug node 206. The debug endpoint 204 forwards the debug message to the debug node 206 designated in the debug message using an internal bus/fabric within the chiplet 202. Debug messages may facilitate a simple register read/write mechanism at the debug nodes 206 to trigger various test and/or debug actions that are specific to the interface or function corresponding to the particular debug node 206. What functionality, parameters, information, etc., is controlled or observed via debug nodes 206 is design-specific. In some cases, the functionality, parameters, information, etc., may be based on or partially or fully correspond to those already defined in specifications such as PCIe, CXL, UCIe, etc. Some examples are test or debug functionality relating to external interfaces like PCIe, CXL, DRAM, etc., test or debug functionality relating to internal modules or blocks, or test or debug functionality relating to die-to-die interfaces, such as UCIe™.

In some embodiments, a debug message can instruct a debug node 206 to enter a streaming mode, in which the debug node 206 continually streams debug messages to the debug endpoint 204 or to a package debug endpoint 204 on another chiplet 202 in the same package 302. Additionally or alternatively, a debug message can instruct a debug node 206 to dump internal state for debug on specific internal events. In these cases, debug messages can be autonomously generated by the debug nodes 206 that are sent to the debug endpoint 204 on the chiplet 202 and/or to a package debug endpoint 204 on another chiplet 202 in the same package 302. The driver interfacing with a debug node 206 has the responsibility to query the debug system capability to absorb such streaming or burst packets before enabling such features in the debug node 206. In the illustrative embodiment, the maximum size of such packets cannot exceed 128 bytes. In some embodiments, debug nodes 206 can provide a mechanism to snapshot debug signals onto the vendor-defined registers that can then be read out.

In operation, the test/debug software is responsible for assigning the endpoint ID to each chiplet 202 and programming the routing registers in each chiplet 202. The package endpoint is responsible for receiving debug messages from the external test/debug software and forwarding the debug commands to the destination debug endpoint 204 or debug node 206. The test/debug software configures the debug endpoints 204 of each chiplet 202 in the integrated circuit package 302, such as by using a depth-first search to identify all debug endpoints 204. For example, in the example shown in FIG. 4, after chiplet 304 with DEID 0 is configured, that chiplet 304 configures adjacent chiplets 304 with DEID 1 and DEID 2. The test/debug software then configures chiplet 304 with DEID 3 and chiplet 306 with DEID 4 via the interconnect 308 between chiplet 304 with DEID 1 and chiplet 304 with DEID 3. By doing the configuration depth first, debug endpoint values of all debug endpoints 204 below an interconnect link 308 from the package debug endpoint 204 can be contiguous, simplifying routing of debug messages.

Figure 4:
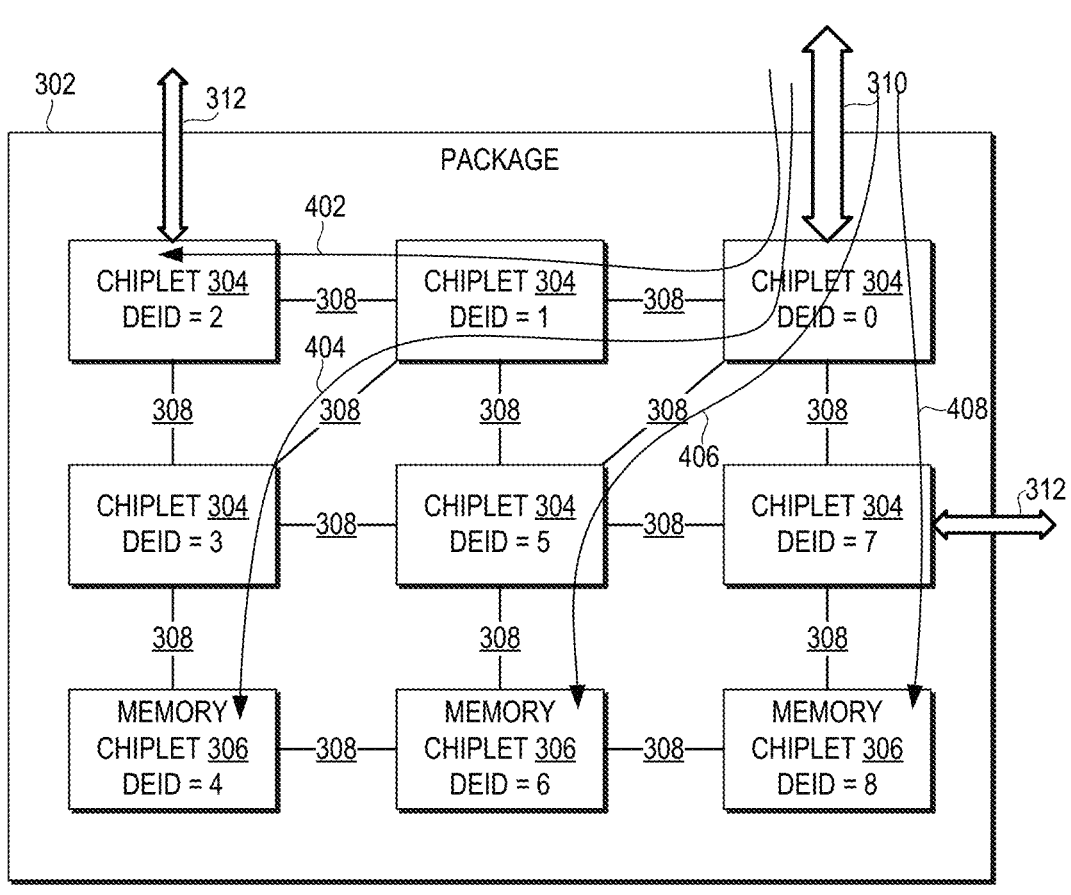
FIG. 4 is a simplified drawing of the integrated circuit package of FIG. 3 showing various routing paths in the integrated circuit package.

Referring now to FIG. 4, in one embodiment, example routing paths 402, 404, 406, 408 for sending messages to various chiplets 304, 306 are shown. In the illustrative embodiment, the routing paths 402, 404, 406, 408 are determined based on range registers associated with interconnects 308 between chiplets 304, 306. For example, the range register associated with the interconnect 308 between chiplet 304 with DEID 0 and chiplet 304 with DEID 1 is set for debug endpoints 204 1-4. The range register associated with the interconnect 308 between chiplet 304 with DEID 0 and chiplet 304 with DEID 5 is set for debug endpoints 204 5-6. The range register associated with the interconnect 308 between chiplet 304 with DEID 1 and chiplet 304 with DEID 2 is set for debug endpoint 204 2. The range register associated with the interconnect 308 between chiplet 304 with DEID 0 and chiplet 304 with DEID 7 is set for debug endpoints 204 7-8. The range register for a debug endpoint 204 has a starting debug endpoint ID value and the length that need to be forwarded down the corresponding port. As the debug/test software will be aware of the chiplet topology in a particular package being tested, the software can configure the debug endpoint IDs in a depth-first fashion and program the route range registers accordingly.

Figure 5:
FIG. 5 is a diagram of one embodiment of a register configuration for the chiplet of FIG. 2.

Referring now to FIG. 5, in one embodiment, a layout of registers 500 in a debug node 206 or debug endpoint 204 is shown. Fields with vertical lines in the background apply to debug nodes 206 and, optionally, to debug endpoints 204. Fields with diagonal lines in the background apply to debug endpoints 204 and are reserved for debug nodes 204.

UDx_CAP[7:0] in a debug endpoint 204 indicates the number of debug nodes 206 the debug endpoint 204 supports. UDx_CAP[8] indicates whether debug functionality is present. UDx_CAP[8] is always set for debug nodes 206 and may be set for debug endpoints 204, if debug functionality is present. UDx_CAP[11:9] indicates a type of a debug node 206, where 0 indicates UCIe.D2D, 1 indicates UCIe.PHY, 2 indicates UCIe.D2D_p_PHY, 3 indicates PCIe, 4 indicates CXL, 5 indicates streaming protocol, 6-14 are reserved, and 15 indicates a custom type. UDx_CAP[13] indicates whether a debug node 206 is timestamp capable. UDx_CAP[14] indicates the size of routing registers, where 0 indicates 4-bit range registers and 1 indicates 8 bit range registers. Rt_Base and Rt_Len indicate debug endpoint 204 range registers for UCIe, PCIe, or CXL spokes to route debug messages.

It should be appreciated that the layout of registers 500 shown in FIG. 5 is merely one possible embodiment, and other embodiments may have more, fewer, or different registers arranged in a different manner.

Referring now to FIG. 6, in one embodiment, an illustrative header 600 for an illustrative debug message is shown. An optional payload can be used to read or write content. In one illustrative embodiment, four byte read and write to the registers shown in FIG. 5 are supported. Support for larger read/write sizes up to a maximum size of 128 bytes may be implementation specific. In the illustrative embodiment, there is a 1:1 correspondence between request count and completion count. Illustrative read and write commands have a completion packet back and have either a success or error indicator in the header.

The debug messages with the header 600 can be sent over a PCIe link as a normal PCIe VDM TLP, can be embedded within a NOP flit on PCIe link, can be tunneled over USB or I2C/SMBus, or can be setup via registers in a JTAG based test/debug setup. The Destination ID field in the debug message header 600 may be irrelevant and set to 0x0. The routing type may be set to "Terminate at receiver."

When debug messages are routed between chiplets over UCIe™, either a mainband channel can be used or a sideband channel can be used, as indicated by UDH-ID[0] in the debug message.

Debug nodes 206 can optionally support timestamp functionality as part of debug data dump. If debug nodes 206 support timestamp, the timestamp always occupies the first double word of the payload, and it is indicated with the "Timestamp Present (TP)" bit being set in the debug message.

Referring now to FIG. 7, in some embodiments, a debug message may be tunneled inside a PCIe NOP flit in order to provide for the condition where only the PCIe link PHY layer is up, if the PCIe link passes the PHY layer training and it supports PCIe flit mode. To support this feature, during PHY layer training, "PHY Debug NOP Flit Mode" should be negotiated in the Modified TS1/TS2 training sequence of 8b/10b encoding, using the N_FTS field which is reserved otherwise in flit mode. Once negotiated, debug NOP flits can be sent with tunneled debug messages inside, as shown in FIG. 7. Field 702 is the Flit_Marker indicator. Field 704 is the Flit_Status. Field 706 indicates the PTM Message contained in the flit. The type and subtype fields in Flit_Marker in DLP are used to indicate what format the bytes 0-235 of the NOP flit has. The type field indicates the format of the debug NOP flits (e.g., PCIe, CXL, or vendor-defined). In an illustrative embodiment, type 0x0 indicates PCIe consortium-defined debug NOP flit, type 0x1 indicates CXL consortium-defined debug NOP flit, type 0x2 indicates vendor-defined debug NOP flit, and other types are reserved. For type 0x0, sub-type 0x0 indicates N tunneled TLPs in bytes 0-235 of the associated flit, sub-type 0x1 indicates FC information tracked by Tx in bytes 0-235 of the associated flit, and sub-type 0x2 indicates FC information tracked by Rx in bytes 0-235 of the associated flit.

In the illustrative embodiment, for debug messages, the type is 0x0, and the sub-type is 0x0 to indicate that debug messages are being tunneled inside the NOP TLPs. As many debug messages can be included inside as long as they do not roll over into the next flit. Sub-type opcodes are also provided to debug various new features of PCIe 6.0, such as shared FC. As this mechanism lacks proper flow control, if a receiver is unable to process a debug message it received, it may simply drop the packet and set a status bit in the UDx_Status register so indicating.

For connecting to the debug system on a chiplet 202 through PCIe flits, there are two scenarios of operation. In the first scenario, a stand-alone logic analyzer can be connected to a PCIe port of the chiplet, such as through interconnect 210. In this case, the logic analyzer only receives the debug flits described above and captures the debug information, which is then visualized to the user. In the second scenario, the chiplet 202 is connected to an active PCIe link, such as through interconnect 210. In such a scenario, debug information is periodically or opportunistically sent as debug flits, which do not go through the replay buffer or the transaction layer queues. Additionally or alternatively, the PCIe device on the link can act as a bridge to a different interface, which can then receive the debug information.

In an illustrative embodiment, a debug capability structure is defined that advertises that the chiplet 202 is capable of sending and receiving debug flits. The frequency of debug flits can be defined in a configuration register, which can indicate that x consecutive debug flits should be sent every y flits, with (x=1, y=0) indicating an opportunistic debug flit insertion and (x=0, y=0) indicating all debug flits for cases such as one with a stand-alone logic analyzer connected to the chiplet 202. Chiplets 202 that support this capability structure are expected to bypass their link and transaction layers and connect through their chip-specific internal interface to the debug flits from their logical PHY. The chiplet 202 can then route to/from the debug endpoint 204 logic.

If the chiplet 202 supports the stand-alone mode, it must advertise that capability in the capability register. It must have registers under this capability structure for the following: (i) target link speed, (ii) Tx preset or coefficient (1b), (iii) per-lane Tx preset value (4b) (iv) per-pane Tx equalization values: 2nd precursor (C-2)-3bits, 1st precursor (C-1)-4bits, post-cursor (C+1)-5 bits, (vi) bypass to L0 (1b), (vii) training time for logic analyzer with TS1 ordered sets in milliseconds-8 bits. The expectation is that the test set-up has been checked for the optimal preset and coefficients for the data rate at which the logic analyzer works and that value is programmed. The PCIe endpoint on the chiplet 202 ignores what it receives when this mode is enabled, sets up each of its transmitter lanes at the target data rate with either the programmed preset or coefficients, waits for the bypass to L0 to be set to 1, sends the required number of TS1 ordered sets followed by 32 TS2 ordered sets (with EIEOS and SKP OS as required by the specification), sends a SDS ordered set, and then enters L0 where it sends debug flits while sending the periodic SKP ordered sets.

In a normal link with two fully functional ports, the debug mode needs to be negotiated along with flit mode in the TS2 ordered sets (and modified TS2 ordered sets for alternate protocol such as CXL) during configuration state on symbol 3, which is currently reserved for flit mode (used for NFTS in non-flit mode) as follows: use bit 0: debug flit supported, bits 7:1 continue to be reserved. The debug flits are enabled (and reflected in a status register in the debug capability) when both sides support it, irrespective of whether retimers, if any, support it or not.

It should be appreciated that the embodiments described in detail above are merely some possible embodiments of the concepts disclosed herein related to a unified test and debug architecture, and other embodiments are envisioned as well. For example, an on-chip network may be implemented in a manner other than a hub-and-spoke model, such as a mesh network. The protocol and debug messages used to communicate may be implemented differently than the manner described above. In general, other embodiments may allow for debug messages to be received over, e.g., a PCIe link in one chiplet 202 of an integrated circuit package 302. Those debug messages can then be routed within chiplets 202 and between chiplets 202 of the integrated circuit package 302 to arrive at a target chiplet 202 or debug node 206 within a chiplet 202, which may implement debug functionality and/or return information to the requesting device using debug messages. The approaches described herein allow for a common approach to debugging individual chiplets 202 from different vendors and debugging chiplets 202 from different vendors that have been integrated into the same integrated circuit package 302.

Figure 8:
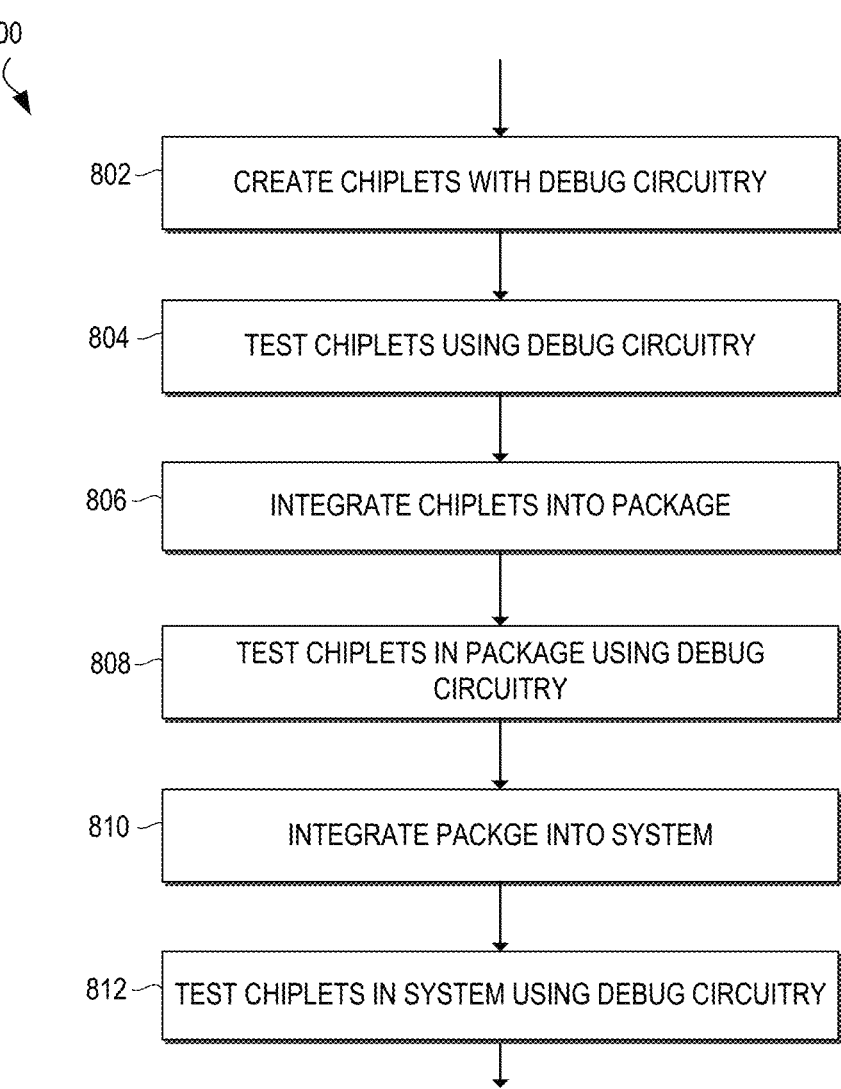
FIG. 8 is a simplified flow diagram of one embodiment of a method that may be performed to test the chiplet of FIG. 2.

Referring now to FIG. 8, in use, a method 800 for creating and testing chiplets 202 may be executed. As described in more detail below, hardware such as a compute device (which may be similar to the compute device 100) with test/debug software may be used to test and/or debug chiplets 202, integrated circuit packages 302, and systems. The test/debug software may be implemented as instructions carried by or stored on a transitory or non-transitory machine-readable (e.g., computer-readable) storage medium, which may be read and executed by one or more processors. Additionally or alternatively, hardware such as a logic analyzer may be connected to a chiplet 202, package 302, or system to test/debug the chiplet 202, package 302, or system.

The method 800 begins in block 802, in which one or more chiplets 202 are created with debug circuitry, such as debug endpoints 204, debug nodes 206, interconnects 208, and any other on-chiplet network components. In block 804, the chiplets 202 are tested using the debug circuitry. For example, in one embodiment, a logic analyzer is connected to an external interconnect of the chiplet 202, such as interconnect 210. Software on or controlling the logic analyzer sends debug messages to the chiplet 202, configuring the debug circuitry. The logic analyzer sends and receives debug messages to, e.g., read and write registers, trigger debug functionality, receive debug information, etc. If a failure or bug is detected, the chiplet 202 may be discarded, preventing a bad chiplet 202 from being integrated into an integrated circuit package 302. Additionally or alternatively, a full link such as a PCIe link may be established with the chiplet 202, with debug messages being sent to test the chip in a similar manner.

In block 806, one or more chiplets 202 are integrated into an integrated circuit package 302. The chiplets 202 may be connected to each other through an on-package network, such as through the interconnects 308.

In block 808, the chiplets 202 in the integrated circuit package 302 are tested using the debug circuitry on the chiplets 202. A link may be established with one chiplet 202, which can route debug messages to other chiplets 202, as described above. Software may enumerate the various chiplets 202 and test the functionality of each, as appropriate. A package 302 with a defective chiplet 202 may have the chiplet 202 replaced or may be discarded entirely.

In block 810, the package 302 is integrated into a system, such as by connecting the package 302 with other packages 302 or other components of a compute device 100.

In block 812, the chiplets 202 in the package 302 are tested at the system level. For example, debug software may be run by the operating system or as an application on the compute device 100 that includes the package 302. In another example, remote debug software may interface with the compute device 100 that includes the package 302 to test and/or debug the chiplets 202, such as by using the communication circuitry 110.

EXAMPLES

Illustrative examples of the technologies disclosed herein are provided below. An embodiment of the technologies may include any one or more, and any combination of, the examples described below.

Example 1 includes a chiplet comprising a plurality of debug nodes, wherein individual debug nodes of the plurality of debug nodes are to implement a debug functionality; and an on-chiplet network, the on-chiplet network connecting the plurality of debug nodes, wherein the on-chiplet network includes circuitry to directly connect at least one debug node of the plurality of debug nodes to an on-chiplet network of an other chiplet.

Example 2 includes the subject matter of Example 1, and wherein the chiplet and the other chiplet are integrated on an integrated circuit package, wherein one or more debug nodes of the plurality of debug nodes are to receive a debug message from a device off of the integrated circuit package; determine that a target for the debug message is the other chiplet; and route the debug message to the other chiplet.

Example 3 includes the subject matter of any of Examples 1 and 2, and wherein one or more debug nodes of the plurality of debug nodes are to receive a debug message wrapped in a packet compliant with a first protocol; unwrap the debug message from the packet compliant with the first protocol; and send the debug message to the other chiplet using a second protocol different from the first protocol.

Example 4 includes the subject matter of any of Examples 1-3, and wherein the first protocol is a peripheral component interconnect express (PCIe) protocol, and wherein the second protocol is a universal chiplet interconnect express (UCIe) protocol.

Example 5 includes the subject matter of any of Examples 1-4, and further including a debug endpoint, wherein the debug endpoint is to receive debug messages and route debug messages to the plurality of debug nodes.

Example 6 includes the subject matter of any of Examples 1-5, and wherein individual debug nodes of the plurality of debug nodes are configurable to, in response to receipt of a debug message, enter a streaming mode, in which the debug node continually sends debug messages to a debug endpoint on the chiplet.

Example 7 includes the subject matter of any of Examples 1-6, and wherein individual debug nodes of the plurality of debug nodes are configurable to, in response to receipt of a debug message, enter a dump mode, in which the debug node, in response to an internal event, sends information of an internal state to a debug endpoint on the chiplet.

Example 8 includes the subject matter of any of Examples 1-7, and wherein the debug functionality of a first debug node of the plurality of debug nodes is a memory built-in self test (MEMBIST).

Example 9 includes the subject matter of any of Examples 1-8, and wherein the debug functionality of a second debug node of the plurality of debug nodes is an interconnect test functionality.

Example 10 includes an integrated circuit package comprising the chiplet of claim 1 and one or more additional chiplets.

Example 11 includes a compute device comprising the integrated circuit package of claim 10, a processor, and a memory.

Example 12 includes an integrated circuit package comprising a plurality of chiplets, wherein individual chiplets of the plurality of chiplets comprise one or more debug nodes and an on-chiplet network, wherein individual debug nodes of the one or more debug nodes of individual chiplets of the plurality of chiplets implement a debug functionality; and package interconnect circuitry to connect the on-chiplet networks of the plurality of chiplets, wherein the one or more debug nodes of individual chiplets of the plurality of chiplets are able to communicate with the one or more debug nodes of other chiplets of the plurality of chiplets using the package interconnect circuitry.

Example 13 includes the subject matter of Example 12, and further including a package debug endpoint on a first chiplet of the plurality of chiplets, wherein the package debug endpoint comprises link endpoint circuitry to form an off-package link with a device.

Example 14 includes the subject matter of any of Examples 12 and 13, and wherein the link endpoint circuitry is to form a peripheral component interconnect express (PCIe) link with the device, wherein the link endpoint circuitry is to form a universal chiplet interconnect express (UCIe) with another chiplet of the plurality of chiplets.

Example 15 includes the subject matter of any of Examples 12-14, and wherein the package debug endpoint is to receive a debug message from the device over the off-package link; determine that a target for the debug message is an other chiplet of the plurality of chiplets; and route the debug message to the other chiplet.

Example 16 includes the subject matter of any of Examples 12-15, and wherein the package debug endpoint is to receive a debug message wrapped in a packet compliant with a first protocol; unwrap the debug message from the packet for the first protocol; and send the debug message to an other chiplet using a second protocol different from the first protocol.

Example 17 includes the subject matter of any of Examples 12-16, and wherein the first protocol is a peripheral component interconnect express (PCIe) protocol, wherein the second protocol is a universal chiplet interconnect express (UCIe) protocol.

Example 18 includes a compute device comprising the integrated circuit package of claim 12, a processor, and a memory.

Example 19 includes a method comprising testing a chiplet using a plurality of debug nodes of the chiplet before the chiplet is integrated into an integrated circuit package; integrating the chiplet into the integrated circuit package with a plurality of other chiplets, wherein integrating the chiplet into the integrated circuit package comprises connecting the chiplet to the plurality of other chiplets with package interconnect circuitry; and testing the chiplet using the plurality of debug nodes and the package interconnect circuitry while the chiplet is integrated into the integrated circuit package.

Example 20 includes the subject matter of Example 19, and further including integrating the integrated circuit package into a compute device; and testing the chiplet using the plurality of debug nodes and the package interconnect circuitry while the integrated circuit package is integrated into the compute device.

The invention claimed is:

1. A chiplet comprising:
a plurality of debug nodes, wherein individual debug nodes of the plurality of debug nodes are configured to implement a debug functionality; and
an on-chiplet network, the on-chiplet network connecting the plurality of debug nodes, wherein the on-chiplet network includes circuitry to directly connect at least one debug node of the plurality of debug nodes to an on-chiplet network of an other chiplet,
wherein one or more debug nodes of the plurality of debug nodes are configured to:
receive a debug message wrapped in a packet compliant with a first protocol;
unwrap the debug message from the packet compliant with the first protocol; and
send the debug message to the other chiplet using a second protocol different from the first protocol.

2. The chiplet of claim 1, wherein the chiplet and the other chiplet are integrated on an integrated circuit package, wherein one or more debug nodes of the plurality of debug nodes are configured to:
receive a debug message from a device off of the integrated circuit package;
determine that a target for the debug message is the other chiplet; and
route the debug message to the other chiplet.

3. The chiplet of claim 1, wherein the first protocol is a peripheral component interconnect express (PCIe) protocol, and wherein the second protocol is a universal chiplet interconnect express (UCIe) protocol.

4. The chiplet of claim 1, further comprising a debug endpoint, wherein the debug endpoint is configured to receive debug messages and route debug messages to the plurality of debug nodes.

5. The chiplet of claim 1, wherein individual debug nodes of the plurality of debug nodes are configurable to, in response to receipt of a debug message, enter a streaming mode, in which the debug node continually sends debug messages to a debug endpoint on the chiplet.

6. The chiplet of claim 1, wherein individual debug nodes of the plurality of debug nodes are configurable to, in response to receipt of a debug message, enter a dump mode, in which the debug node, in response to an internal event, sends information of an internal state to a debug endpoint on the chiplet.

7. The chiplet of claim 1, wherein the debug functionality of a first debug node of the plurality of debug nodes is a memory built-in self test (MEMBIST).

8. The chiplet of claim 7, wherein the debug functionality of a second debug node of the plurality of debug nodes is an interconnect test functionality.

9. An integrated circuit package comprising the chiplet of claim 1 and one or more additional chiplets.

10. A compute device comprising the integrated circuit package of claim 9, a processor, and a memory.

11. The chiplet of claim 1, wherein individual debug nodes of the plurality of debug nodes comprise mailbox registers, the mailbox registers including fields for at least one of opcodes, capability identifiers, address offsets, data, control, and status, and wherein the mailbox registers are configurable to support vendor-defined operations and standardized capability access for debug functionality.

12. The chiplet of claim 1, wherein at least one debug node of the plurality of debug nodes is configured to include a timestamp in debug data sent in response to a debug message.

13. The chiplet of claim 1, wherein individual debug nodes of the plurality of debug nodes present vendor identification and device identification values in standardized registers, and are configured to support capability discovery via debug messages.

14. An integrated circuit package comprising:
a plurality of chiplets, wherein individual chiplets of the plurality of chiplets comprise one or more debug nodes and an on-chiplet network, wherein individual debug nodes of the one or more debug nodes of individual chiplets of the plurality of chiplets implement a debug functionality;
package interconnect circuitry to connect the on-chiplet networks of the plurality of chiplets; and
a package debug endpoint on a first chiplet of the plurality of chiplets,
wherein the one or more debug nodes of individual chiplets of the plurality of chiplets are able to communicate with the one or more debug nodes of other chiplets of the plurality of chiplets using the package interconnect circuitry,
wherein the package debug endpoint comprises link endpoint circuitry configured to form an off-package link with a device,
wherein the link endpoint circuitry is configured to form a peripheral component interconnect express (PCIe)

link with the device, wherein the link endpoint circuitry is configured to form a universal chiplet interconnect express (UCIe) with another chiplet of the plurality of chiplets.

15. The integrated circuit package of claim 14, wherein the package debug endpoint is configured to:
receive a debug message from the device over the off-package link;
determine that a target for the debug message is an other chiplet of the plurality of chiplets; and
route the debug message to the other chiplet.

16. The integrated circuit package of claim 14, wherein the package debug endpoint is configured to:
receive a debug message wrapped in a packet compliant with a first protocol;
unwrap the debug message from the packet for the first protocol; and
send the debug message to an other chiplet using a second protocol different from the first protocol.

17. The integrated circuit package of claim 16, wherein the first protocol is a peripheral component interconnect express (PCIe) protocol, wherein the second protocol is a universal chiplet interconnect express (UCIe) protocol.

18. A compute device comprising the integrated circuit package of claim 14, a processor, and a memory.

19. A method comprising:
testing a chiplet using a plurality of debug nodes of the chiplet before the chiplet is integrated into an integrated circuit package, wherein the plurality of debug nodes are connected by an on-chiplet network of the chiplet;
integrating the chiplet into the integrated circuit package with a plurality of other chiplets, wherein integrating the chiplet into the integrated circuit package comprises connecting the chiplet to the plurality of other chiplets with package interconnect circuitry and connecting the on-chiplet network of the chiplet to an on-chiplet network of an other chiplet; and
testing the chiplet using the plurality of debug nodes and the package interconnect circuitry while the chiplet is integrated into the integrated circuit package,
wherein testing the chiplet comprises:
receiving, by a debug node of the plurality of debug nodes, a debug message wrapped in a packet compliant with a first protocol;
unwrapping, by the debug node, the debug message from the packet compliant with the first protocol; and
sending, by the debug node, the debug message to the other chiplet using a second protocol different from the first protocol.

20. The method of claim 19, further comprising:
integrating the integrated circuit package into a compute device; and
testing the chiplet using the plurality of debug nodes and the package interconnect circuitry while the integrated circuit package is integrated into the compute device.

* * * * *